(12) United States Patent
Kawamura et al.

(10) Patent No.: US 8,921,240 B2
(45) Date of Patent: Dec. 30, 2014

(54) ION IMPLANTATION METHOD

(75) Inventors: Yasunori Kawamura, Kyoto (JP); Kyoko Kawakami, Kyoto (JP); Yoshiki Nakashima, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 13/428,481

(22) Filed: Mar. 23, 2012

(65) Prior Publication Data
US 2012/0244724 A1 Sep. 27, 2012

(30) Foreign Application Priority Data

Mar. 25, 2011 (JP) .................................. 2011-068307
Jan. 12, 2012 (JP) .................................. 2012-003960

(51) Int. Cl.
*H01L 21/469* (2006.01)
*H01L 21/265* (2006.01)
*H01J 37/08* (2006.01)
*H01J 37/317* (2006.01)

(52) U.S. Cl.
CPC ............. *H01L 21/2658* (2013.01); *H01J 37/08* (2013.01); *H01J 37/3171* (2013.01); *H01J 2237/006* (2013.01); *H01L 21/26506* (2013.01)
USPC ......................................................... 438/798

(58) Field of Classification Search
CPC ..................... H01L 21/2658; H01L 21/26506; H01J 37/08; H01J 37/3171; H01J 2237/006
USPC ............................................. 438/798; 250/427
See application file for complete search history.

(56) References Cited

U.S. PATENT DOCUMENTS

| 6,686,595 | B2 | 2/2004 | Horsky | |
|---|---|---|---|---|
| 8,343,860 | B1* | 1/2013 | Omarjee et al. | 438/515 |
| 2007/0148888 | A1* | 6/2007 | Krull et al. | 438/306 |
| 2011/0174770 | A1* | 7/2011 | Hautala | 216/13 |

FOREIGN PATENT DOCUMENTS

| JP | 10-265944 A | 6/1998 |
|---|---|---|
| JP | 2009518869 A | 5/2009 |

OTHER PUBLICATIONS

English Patent Abstract of JP 2009-518869 from esp@cenet, Publication Date May 7, 2009 (2 Pages).
Patent Abstracts of Japan, Publication No. 10-265944 dated Jun. 10, 1998 (1 page).
Office Action in corresponding Korean Application No. 10-2012-0029260 dated Jul. 19, 2013 (3 pages).

* cited by examiner

*Primary Examiner* — Shaun Campbell
(74) *Attorney, Agent, or Firm* — Osha Liang LLP

(57) ABSTRACT

An ion implantation method includes generating $C_mH_y^+$ ions (m is such an integer as $4 \leq m \leq 6$, and y is such an integer as $1 \leq y \leq 2m+2$) using an ion generating material expressed by $C_nH_x$ (n is such an integer as $4 \leq n \leq 6$, and x is such an integer as $1 \leq x \leq 2n+2$), and implanting the ions into a wafer.

6 Claims, 6 Drawing Sheets

ION IMPLANTATION METHOD

CROSS REFERENCE TO RELATED APPLICATION(S)

This application is based upon and claims the benefit of priorities from Japanese Patent Application No. 2011-068307 filed on Mar. 25, 2011 and Japanese Patent Application No. 2012-003960 filed on Jan. 12, 2012, the entire contents of which are incorporated herein by reference.

TECHNICAL FIELD

The present disclosure relates a method for implanting the molecular ion of carbon into a wafer to generate an amorphous layer in the wafer.

RELATED ART

As the refinement of a semiconductor element advances, there is raised a demand for ion implantation into the very shallow area of a wafer from above. In order to carry out the ion implantation into such area, attention has been paid to a technology which implants molecular ions into the wafer to convert a given area of the wafer surface to an amorphous layer. Also, the study of implantation of the molecular ions of carbon has been advanced because, in an annealing process after ion implantation, it can advantageously reduce defective crystals formed below an amorphous layer.

Such carbon molecular ion implanting technology is disclosed in the patent reference 1. Specifically, the patent reference 1 discloses a technology which, using $C_{16}H_{20}$ or $C_{18}H_{14}$ as the material of the molecular ions of carbon, implants $C_{16}H_x^+$ ions or $C_{18}H_x^+$ ions (X is an integer 1 or more) into a wafer, and a technology which, using $C_{14}H_{14}$ as the material of the molecular ions of carbon, implants $C_7H_7^+$ ions, $C_3H_x^+$ ions or the like (X is an integer 1 or more) into a wafer.

PRIOR ART REFERENCE

[Patent Reference]

[Patent Reference 1] JP-A-2009-518869 (paragraphs 0022~0024, 0045~0046, FIGS. 1, 2, 8)

When an amorphous layer is formed using carbon molecular ions, depending on energy for irradiating ion beams, the thickness of an amorphous layer to be formed using ions having a large mass number is small. In a current semiconductor element manufacturing process, the thickness of an amorphous layer is required to be about 60 nm or more. Thus, recently, in order to produce an amorphous layer having such thickness, persons in the art have paid attention to a technology for implanting $C_4H_x^+$ ions, $C_5H_x^+$ ions or $C_6H_x^+$ ions (X is an integer 1 or more) into a wafer.

However, a method for generating $C_4H_x^+$ ions, $C_5H_x^+$ ions or $C_6H_x^+$ ions and implanting the thus generated ions into the wafer using the technology disclosed in the patent reference 1 has been found very inefficient. The reason for this will be described below.

In the technology disclosed in the patent reference 1, as set forth in the paragraph 0045, $C_4H_x^+$ ions, $C_5H_x^+$ ions or $C_6H_x^+$ ions are generated using $C_{14}H_{14}$. $C_{14}H_{14}$ is a solid material and it has a high boiling point of 284° C. In order to vaporize it, it must be heated at high temperatures, thereby requiring a heater which can meet such high temperatures.

Also, as can be seen from the mass spectrum of ion beams disclosed in FIG. 8 of the patent reference 1, the rate of $C_4H_x^+$ ions, $C_5H_x^+$ ions or $C_6H_x^+$ ions is very small with respect to the whole. Therefore, when implanting $C_4H_x^+$ ions, $C_5H_x^+$ ions or $C_6H_x^+$ ions in large quantities into the wafer, it takes a long time to complete such ion implanting treatment.

SUMMARY

Exemplary embodiments of the invention provide a method for generating $C_4H_x^+$ ions, $C_5H_x^+$ ions or $C_6H_x^+$ ions (x is an integer 1 or larger) and implanting them into a wafer efficiently.

An ion implantation method according to an exemplary embodiment of the invention is an ion implantation method comprising:

generating $C_mH_y^+$ ions (m is such an integer as $4 \leq m \leq 6$, and y is such an integer as $1 \leq y \leq 2m+2$) using an ion generating material expressed by $C_nH_x$ (n is such an integer as $4 \leq n \leq 6$, and x is such an integer as $1 \leq x \leq 2n+2$); and implanting the ions into a wafer.

The ion generating material may have such a mass spectrum that a peak of a relative abundance of $C_4H_u$ (u is such an integer as $1 \leq u \leq 10$), $C_5H_v$ (v is such an integer as $1 \leq v \leq 10$), or $C_6H_w$ (w is such an integer as $1 \leq w \leq 10$) is 20% or more.

The ion generating material may be $C_6H_{12}$.
The ion generating material may be $C_5H_8$.
The ion generating material may be $C_4H_6$.

According to the ion implantation method, it is possible to generate $C_4H_x^+$ ions, $C_5H_x^+$ ions or $C_6H_x^+$ ions (x is an integer 1 or larger) and implant them into a wafer efficiently.

DETAILED DESCRIPTION

Figure 1:
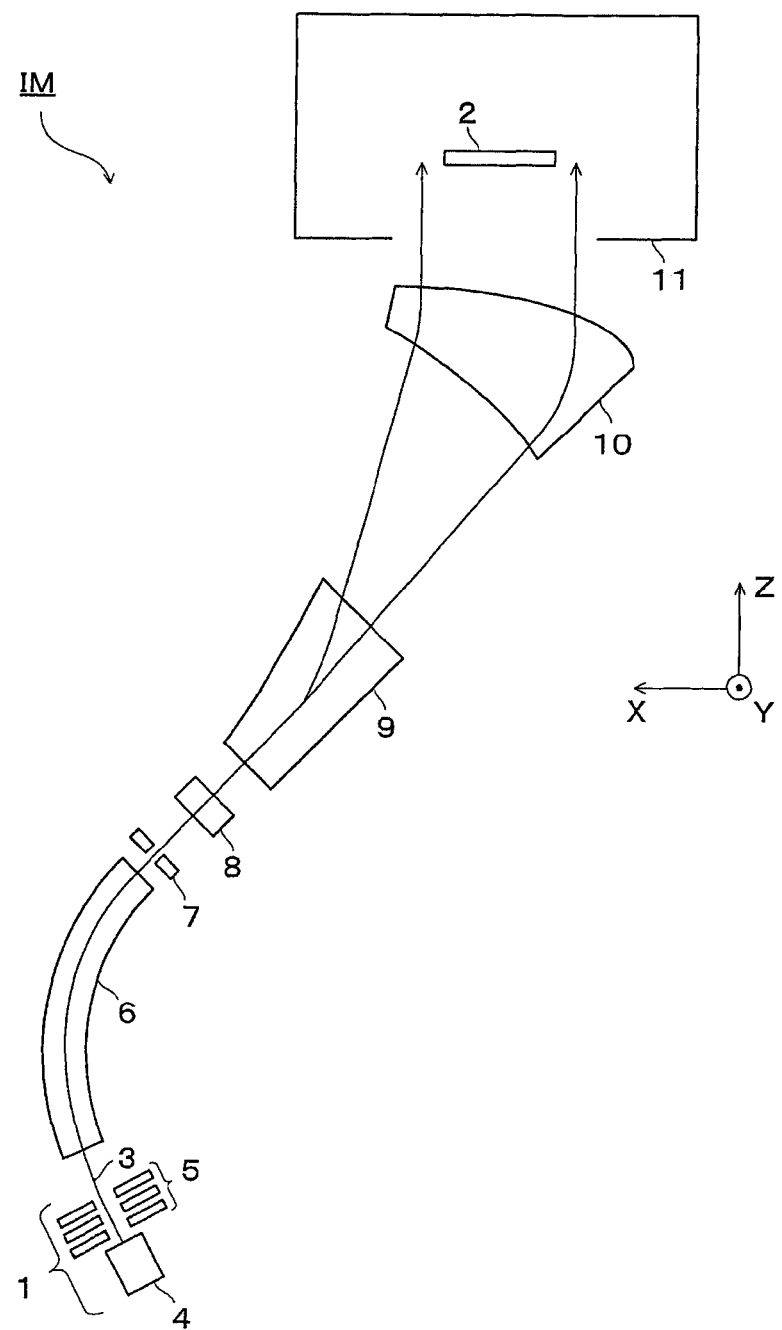
FIG. 1 is a plan view showing an ion implanter according to an embodiment of the invention.

FIG. 1 shows an ion implanter IM according to an embodiment of the invention. In this figure, Z direction indicates the advancing direction of an ion beam, X direction indicates the longitudinal direction of the ion beam with which a wafer is irradiated, and Y direction indicates a direction perpendicular to both of the above directions. Also, the illustrated X, Y and Z axes respectively correspond to the advancing direction and the like of the ion beam within a treatment chamber and, as the ion beam advances along a beam passage, the respective X, Y and Z axes can be changed properly.

Ions generated in an ion source chamber 4 constituting an ion source 1 are extracted out from the ion source chamber 4 by an extraction electrode system 5 as an ion beam 3 having a given amount of energy. The extraction electrode system 5, as known well in a related-art ion implanter, is constituted of three electrodes, that is, an extraction electrode, a restriction electrode, and a ground electrode.

The ion beam 3 having passed through the extraction electrode system 5 contains other ions than desired ions to be implanted into a wafer 2 (for example, a silicon wafer). To extract the desired ions from the ion beam 3, there is carried out mass analysis using a mass analysis electromagnet 6 and an analysis slit 7. Since a large number of ions contained in the ion beam 3 are different in the mass number from each other, the passages of the ions of the ion beam after passage through the mass analysis electromagnet 6 are caused to differ due to a magnetic field to be produced by the mass analysis electromagnet 6. Thus, in the mass analysis electromagnet 6, the magnetic field is adjusted in order that only the desired ions can pass through the analysis slit 7. Here, in FIG. 1, for simplified illustration, the beam passages of other ions than the desired ions are omitted.

After having passed through the analysis slit 7, the shape of the ion beam 3 is adjusted by a quadrupole lens 8 and is then scanned by a scanner 9 so that it provides a ribbon-shaped ion beam 3 long in one direction. In this case, an electromagnet is assumed as the scanner. However, as conventionally known, alternatively, an electrostatic plate may be used to scan the ion beam 3 by an electric field. Finally, the ion beam 3 is adjusted in shape by a paralleling device 10 so that its outside has a parallel shape, and the ion beam 3 is irradiated onto the wafer 2 disposed within a treatment chamber 11.

The wafer 2 disposed within the treatment chamber 11 is supported, for example, by a platen including an electrostatic chuck. The platen is reciprocatingly moved along the Y direction by a drive mechanism (not shown) to cross the ion beam 3, thereby implanting ions into the wafer 2. Here, as shown in FIG. 1, the X direction dimension of the ion beam 3 having passed through the scanner 9 and paralleling device 10 is longer than the wafer 2 disposed within the treatment chamber 11.

Within the ion source chamber 4 shown in FIG. 1, for example, ions are generated in the following manner. This will be described below with reference to FIG. 2.

To the ion source chamber 4, there is connected a gas introduction passage 17 for introducing gas for ion generation into the ion source chamber 4. The gas introduction passage 17 is connected through a mass flow controller 18 to a first gas supply source 13, a second gas supply source 14 and a third gas supply source 15. Gases from the respective gas sources can be independently introduced into the ion source chamber 4 by opening and closing their associated valves 16.

In this embodiment, as materials for generating $C_4H_X^+$ ions, $C_5H_X^+$ ions or $C_6H_X^+$ ions (X is an integer 1 or more), $C_6H_{12}$ (cyclohexane) is filled in the first gas supply source 13, $C_5H_8$ (cyclopenten) is filled in the second gas supply source 14, and $C_4H_6$ (butadiene) is filled in the third gas supply source 15. These materials are generally sold commercially for industrial use and are cheaper than $C_{14}H_{14}$ (dibenzyl) used in the patent reference 1. Further, $C_4H_X^+$ ions, $C_5H_X^+$ ions or $C_6H_X^+$ ions (X is an integer 1 or more) can be generated more efficiently than $C_{14}H_{14}$ (dibenzyl).

FIGS. 3 to 6 show the mass spectra of the respective materials. With the mass spectrum of $C_{14}H_{14}$ (dibenzyl) shown in FIG. 6, although the peak of the relative abundance of $C_5H_X$ (X is an integer 1 or more) is slightly lower than 20%, those of $C_4H_X$ (X is an integer 1 or more) and $C_6H_X$ (x is an integer 1 or more) are less than 10%. On the other hand, with the mass spectrum of $C_6H_{12}$ (cyclohexane) shown in FIG. 3, the peak of the relative abundance of $C_4H_X$ (X is an integer 1 or more) is 100%, the peak of the relative abundance of $C_5H_X$ (X is an integer 1 or more) is about 30%, and the peak of the relative abundance of $C_6H_X$ (X is an integer 1 or more) is more than 80%. Also, with the mass spectrum of $C_5H_8$ (cyclopenten) shown in FIG. 4, the peak of the relative abundance of $C_4H_X$ (X is an integer 1 or more) is more than 20%, and the peak of the relative abundance of $C_5H_X$ (X is an integer 1 or more) is 100%. With the mass spectrum of $C_4H_6$ (butadiene), the peak of the relative abundance of $C_4H_X$ (X is an integer 1 or more) is more than 90%.

As can be understood from the above comparisons, since $C_6H_{12}$ (cyclohexane), $C_5H_8$ (cyclopenten) and $C_4H_6$ (butadiene) are used, when compared with $C_{14}H_{14}$ (dibenzyl) used in the patent reference 1, the generation efficiency of $C_4H_X^+$ ions, $C_5H_X^+$ ions or $C_6H_X^+$ ions (X is an integer 1 or more) can be remarkably enhanced.

Referring again to FIG. 2, the first and second gas supply sources 13 and 14 include heaters 20 respectively. Since $C_6H_{12}$ (cyclohexane) and $C_5H_8$ (cyclopenten) are liquid at room temperature, in order to introduce them into the ion source chamber 4 through the gas introduction passage 17, they must be vaporized. Therefore, they must be heated using the heaters 20.

However, the temperature to which these liquid materials must be heated is lower than the temperature to which $C_{14}H_{14}$ (dibenzyl) must be heated. The reason for this is that the boiling point of $C_6H_{12}$ (cyclohexane) is about 81° C. and that of $C_5H_8$ (cyclopenten) is about 44° C.

Therefore, there is no need to use a heater of a high temperature type which can heat and vaporize $C_{14}H_{14}$ (dibenzyl). In this respect as well, use of $C_6H_{12}$ (cyclohexane) and $C_5H_8$ (cyclopenten) as ion generating materials can provide an advantage.

Since $C_4H_6$ (butadiene) filled in the third gas supply source 15 is gas at room temperature, the third gas supply source 15 does not include such heater 20 as in the first and second gas supply sources 13 and 14.

Using an electron gun 12 provided outside the ion source chamber 4, an electron e is supplied to a gas introduced into the ion source chamber 4 from any one of the first to third gas supply sources 13 to 15. This type of electron gun 12 is disclosed in the prior art reference (U.S. Pat. No. 6,686,595) cited by the patent reference 1 and thus the specific description thereof is omitted here. In brief, the electron gun 12 includes a filament for generating the electron e and an electrode for converting the electron e generated by the filament to an electron e having a given amount of energy and extracting out this electron e into the ion source chamber 4. Outside the ion source chamber 4, there is disposed a beam dump 21. When the potential of the beam dump 21 supplied from a supply source (not shown) is higher than that of the ion source chamber 4, the electron e extracted out by the electrode will collide with the beam dump 21 and disappear. Oppositely, when the potential of the beam dump 21 is lower than that of the ion source chamber 4, the electron e extracted out by the electrode will be reflected by the beam dump 21.

Outside the ion source chamber 4, there are disposed a pair of permanent magnets (not shown) in such a manner that they surround the ion source chamber 4 between them. The permanent magnets generate a magnetic field in a direction shown by the arrow B in FIG. 2 within the ion source chamber 4.

The electron e introduced from the electron gun 12 into the ion source chamber 4 moves along the magnetic field within the ion source chamber 4 and collides with a gas introduced into the ion source chamber 4. The collision ionizes the gas to thereby generate ions. After then, the ions generated here are extracted out as the ion beam 3 from the ion beam extraction port 19 of the ion source chamber 4 by an extraction electrode constituting the extraction electrode system 5 shown in FIG. 1. Referring briefly to ions contained in the ion beam 3 generated at this stage, for example, when $C_6H_{12}$ (cyclohexane) is used as the material, the ion beam 3 extracted out through the previously described process contains $C_3H_5^+$, $C_4H_7^+$, $C_4H_8^+$, $C_5H_9^+$, and $C_6H_{11}^+$ ions.

<Other Modifications>

Figure 2:
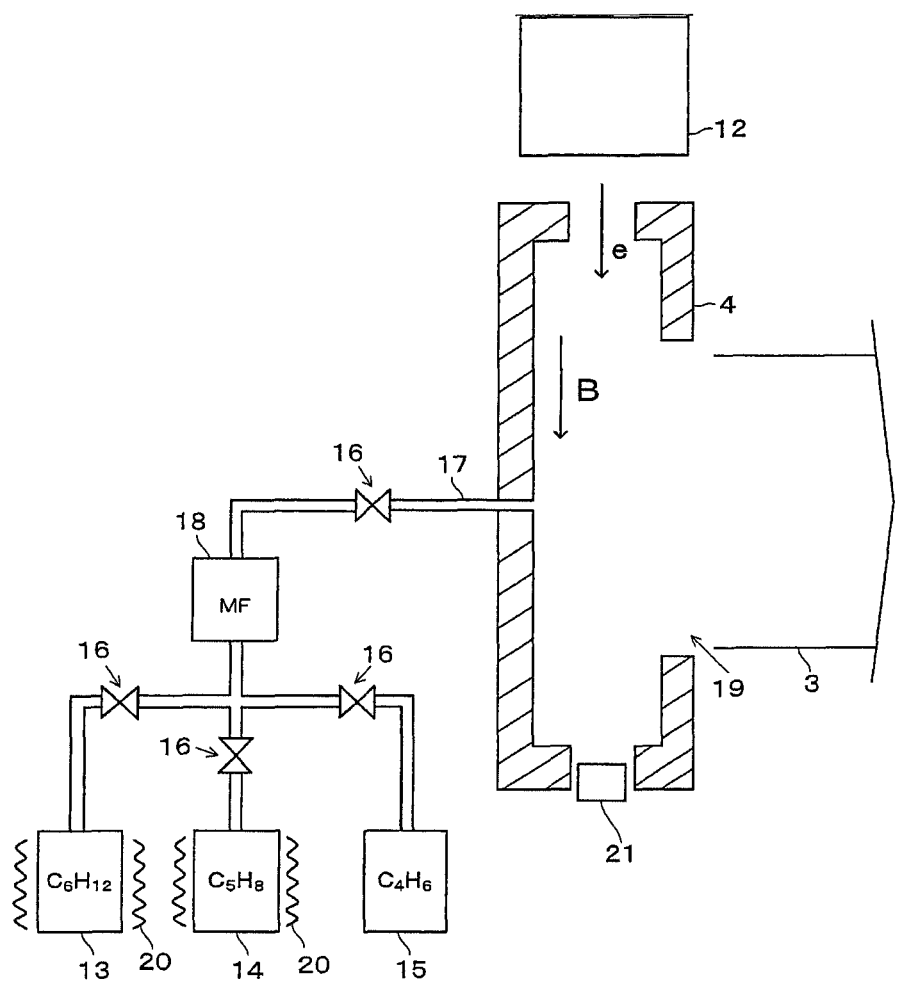
FIG. 2 is a schematic view showing how to generate ions in an ion source chamber.
Figure 3:
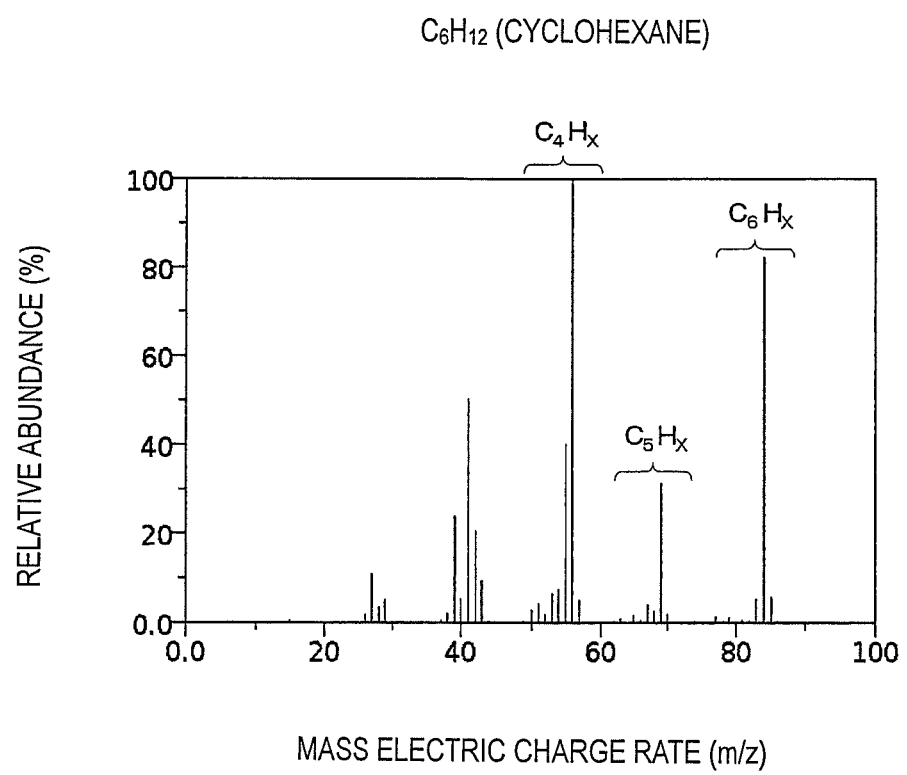
FIG. 3 shows the mass spectra of $C_6H_{12}$.
Figure 4:
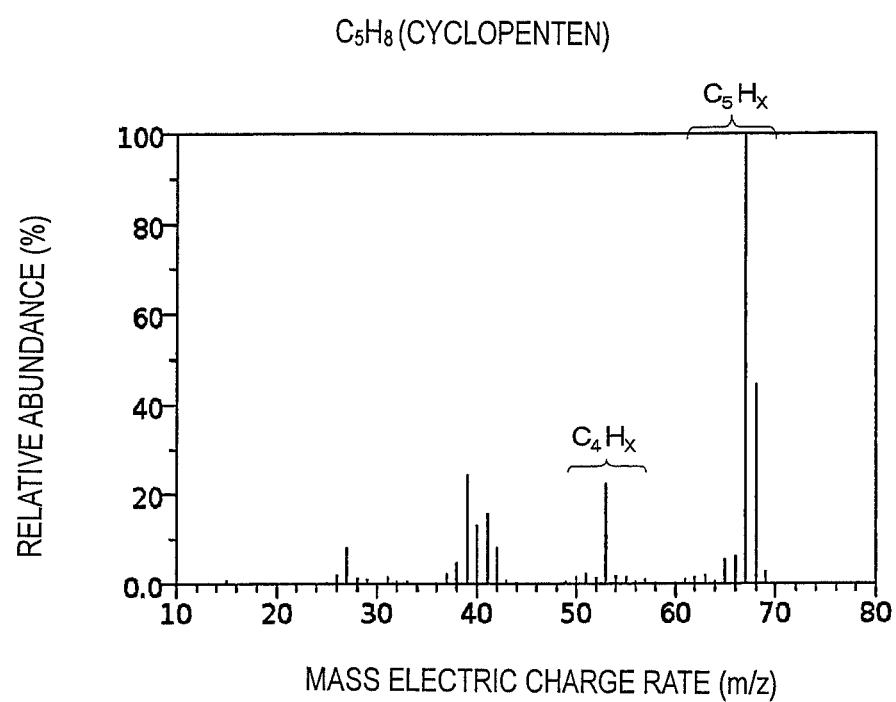
FIG. 4 shows the mass spectra of $C_5H_8$.
Figure 5:
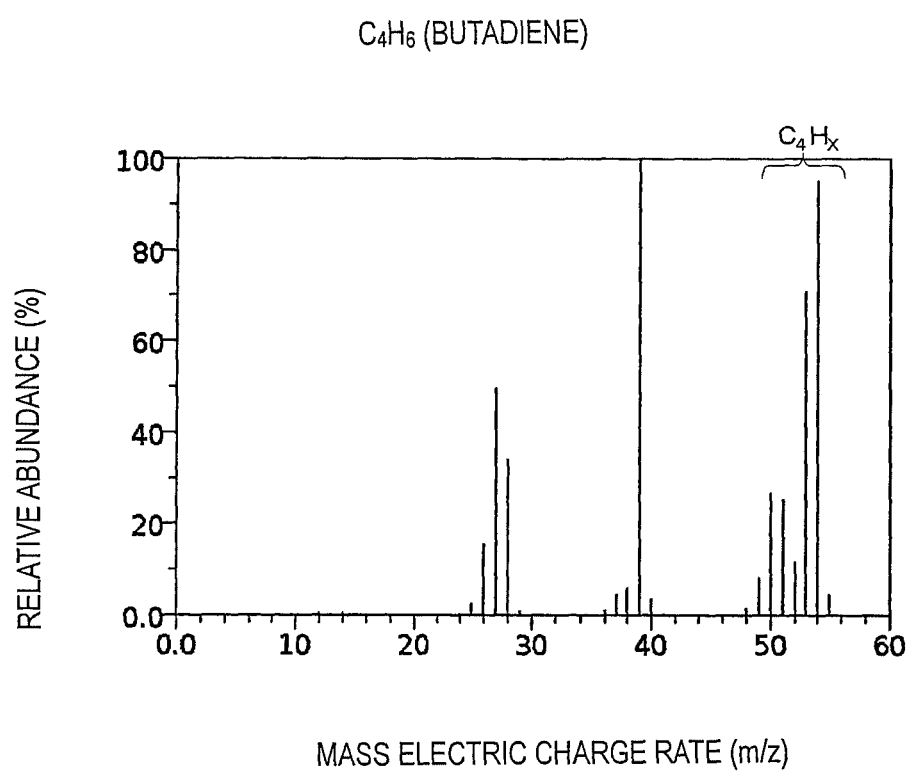
FIG. 5 shows the mass spectra of $C_4H_6$.
Figure 6:
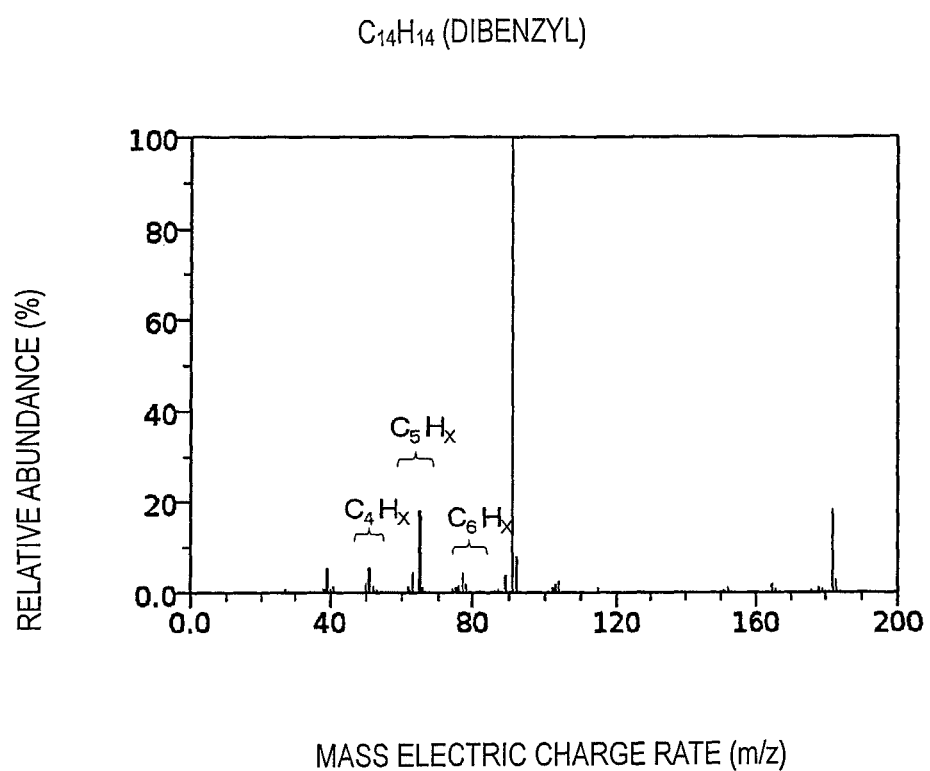
FIG. 6 shows the mass spectra of $C_{14}H_{14}$.

In the description of FIG. 2, description has been given of a structure where the permanent magnets are disposed outside the ion source chamber 4. However, when the capacity of the ion source chamber 4 is small, the electron e is able to reach the inside of the ion source chamber 4 even with no provision of such permanent magnets and, therefore, it is not necessary to provide the permanent magnets specially.

Also, in FIG. 2, description has been given of a system where the electron e is introduced into the ion source chamber 4 using the electron gun 12. However, instead of this, as conventionally known as a Bernas-type ion source, there may also be employed a system where a filament is disposed in the end portion of the ion source chamber 4 and the filament is heated to thereby discharge an electron. Or, instead of the Bernas-type ion source, an indirectly heated ion source may also be used.

Further, in FIG. 2, the number of gas introducing ports to the ion source chamber 4 is one but this is not limitative. For example, the number of gas introducing ports to the ion source chamber 4 may be three and gases respectively from the respective gas supply sources may pass through their individual passages and may be introduced into the ion source chamber 4 from their respective gas introducing ports. In this case, in order to be able to control individually the flow quantities of gasses to be supplied from the respective gas supply sources, there may also be provided three mass flow controllers 18 respectively corresponding to the three gas supply sources. On the other hand, the number of gas supply sources need not be three but the number of gas supply sources may be one or more.

In the above embodiments, as the material for generating ions, there are used $C_6H_{12}$ (cyclohexane), $C_5H_8$ (cyclopenten) and $C_4H_6$ (butadiene). However, the invention is not limited to this. For example, using $C_nH_x$ (n is such an integer as 4≤n≤6, and x is such an integer as 1≤x≤2n+2) as the material, there may be generated $C_mH_y^+$ ions (m is such an integer as 4≤m≤6, and y is such an integer as 1≤y≤2m+2). The values of n and m used here may be equal or different. Also, similarly, x and y may be equal or different.

Further, in this case, there can be selected such material that, with its mass spectrum, the relative abundance of $C_4H_X$, $C_5H_X$ or $C_6H_X$ (X is an integer 1 or more) is 20% or more. In this material, $C_4H_X^+$ ions, $C_5H_X^+$ ions or $C_6H_X^+$ ions (X is an integer 1 or more) can be generated more efficiently than $C_{14}H_{14}$ used in the patent reference 1.

While certain embodiments have been described, these embodiments have been presented by way of example only, and are not intended to limit the scope of the invention. Indeed, the novel method described herein may be embodied in a variety of other forms; furthermore, various omissions, substitutions and changes in the form of the method, described herein may be made without departing from the sprit of the invention. The accompanying claims and their equivalents are intended to cover such forms or modifications as would fall within the scope and sprit of the invention

What is claimed is:

1. A method of implanting carbon molecular ions of $C_4$-$C_6$, comprising:
    generating CmHy+ ions (m is such an integer as 4≤m≤6, and y is such an integer as 1≤y≤2m+2) using an ion generating material expressed by CnHx (n is such an integer as 4≤n≤6, and x is such an integer as 1≤x≤2n+2),
    wherein the ion generating material is ionized and has such a mass spectrum that a peak of a relative abundance of C4Hu (u is such an integer as 1≤u≤10), C5Hv (v is such an integer as 1≤v≤10), or C6Hw (w is such an integer as 1≤w≤10) is 20% or more, and
    wherein the boiling point of the ion generating material is 81° C. or less; and
    implanting either the C4Hu, C5Hv, or C6Hw ions with the relative abundance of 20% or more into a wafer by mass analysis,
    wherein the ion generating material is cyclohexane ($C_6H_{12}$).

2. A method of implanting carbon molecular ions of $C_4$-$C_6$, comprising:
    generating CmHy+ ions (m is such an integer as 4≤m≤6, and y is such an integer as 1≤y≤2m+2) using an ion generating material expressed by CnHx (n is such an integer as 4≤n≤6, and x is such an integer as 1≤x≤2n+2),
    wherein the ion generating material is ionized and has such a mass spectrum that a peak of a relative abundance of C4Hu (u is such an integer as 1≤u≤10), C5Hv (v is such an integer as 1≤v≤10), or C6Hw (w is such an integer as 1≤w≤10) is 20% or more, and
    wherein the boiling point of the ion generating material is 81° C. or less; and
    implanting either the C4Hu, C5Hv, or C6Hw ions with the relative abundance of 20% or more into a wafer by mass analysis,
    wherein the ion generating material is cyclopentene ($C_5H_8$).

3. A method of implanting carbon molecular ions of $C_4$-$C_6$, comprising:
    generating CmHy+ ions (m is such an integer as 4≤m≤6, and y is such an integer as 1≤y≤2m+2) using an ion generating material expressed by CnHx (n is such an integer as 4≤n≤6, and x is such an integer as 1≤x≤2n+2),
    wherein the ion generating material is ionized and has such a mass spectrum that a peak of a relative abundance of C4Hu (u is such an integer as 1≤u≤10), C5Hv (v is such an integer as 1≤v≤10), or C6Hw (w is such an integer as 1≤w≤10) is 20% or more, and
    wherein the boiling point of the ion generating material is 81° C. or less; and
    implanting either the C4Hu, C5Hv, or C6Hw ions with the relative abundance of 20% or more into a wafer by mass analysis,
    wherein the ion generating material is butadiene ($C_4H_6$).

4. The method as set forth in claim 1, wherein the ion generating material is selectively supplied via a common path from any of a first gas supply source, a second gas supply source, and a third gas supply source.

5. The method as set forth in claim 2, wherein the ion generating material is selectively supplied via a common path from any of a first gas supply source, a second gas supply source, and a third gas supply source.

6. The method as set forth in claim 3, wherein the ion generating material is selectively supplied via a common path from any of a first gas supply source, a second gas supply source, and a third gas supply source.

* * * * *